(12) United States Patent
Mardilovich et al.

(10) Patent No.: US 11,910,718 B2
(45) Date of Patent: Feb. 20, 2024

(54) MULTILAYERED PIEZOELECTRIC THIN FILM ELEMENT

(71) Applicant: XAAR TECHNOLOGY LIMITED, Cambridge (GB)

(72) Inventors: Peter Mardilovich, Cambridge (GB); Susan Trolier-McKinstry, University Park, PA (US)

(73) Assignee: Xaar Technology Limited, Cambridge (GB)

( * ) Notice: Subject to any disclaimer, the term of this patent is extended or adjusted under 35 U.S.C. 154(b) by 826 days.

(21) Appl. No.: 17/014,808

(22) Filed: Sep. 8, 2020

(65) Prior Publication Data
US 2021/0013394 A1    Jan. 14, 2021

Related U.S. Application Data

(63) Continuation of application No. 15/523,968, filed as application No. PCT/GB2015/053312 on Apr. 11, 2015, now abandoned.
(Continued)

(51) Int. Cl.
*H10N 30/85* (2023.01)
*H10N 30/06* (2023.01)
(Continued)

(52) U.S. Cl.
CPC .......... *H10N 30/85* (2023.02); *B41J 2/14233* (2013.01); *H10N 30/06* (2023.02);
(Continued)

(58) Field of Classification Search
CPC ...... H10N 30/85; H10N 30/06; H10N 30/078; H10N 30/1051; H10N 30/2047;
(Continued)

(56) References Cited

U.S. PATENT DOCUMENTS

2002/0053859 A1    5/2002  Fukui
2003/0076007 A1    4/2003  Murai
(Continued)

FOREIGN PATENT DOCUMENTS

CN    101981718 A    2/2011
CN    102683557 A    9/2012
(Continued)

OTHER PUBLICATIONS

Wang et al. "Fatigue Behaviors of Bi3.25La0.75Ti3O12/Pb(Zr0.52Ti0.48)O3/ Bi3.25La0.75Ti3O12 Trilayered Thin Films" Integrated Ferroelectrics: an International Journal vol. 85, Issue 1, 2006 pp. 111-118.
(Continued)

*Primary Examiner* — Emily P Pham
(74) *Attorney, Agent, or Firm* — Finnegan, Henderson, Farabow, Garrett & Dunner

(57) ABSTRACT

A piezoelectric thin film element having a first electrode, a second electrode and a piezoelectric thin film between the electrodes, wherein the thin film comprises a laminate having two or more piezoelectric thin film layers and wherein a first thin film layer is doped by one or more dopants and a second film layer is doped by one or more dopants and wherein at least one dopant of the second thin film layer is different from the dopant or dopants of the first thin film layer.

20 Claims, 7 Drawing Sheets

Related U.S. Application Data

(60) Provisional application No. 62/075,153, filed on Nov. 4, 2014.

(51) Int. Cl.
    *H10N 30/078* (2023.01)
    *H10N 30/87* (2023.01)
    *H10N 30/00* (2023.01)
    *H10N 30/20* (2023.01)
    *H10N 30/853* (2023.01)
    *B41J 2/14* (2006.01)

(52) U.S. Cl.
    CPC ....... *H10N 30/078* (2023.02); *H10N 30/1051* (2023.02); *H10N 30/2047* (2023.02); *H10N 30/8554* (2023.02); *H10N 30/87* (2023.02); *B41J 2002/14266* (2013.01)

(58) Field of Classification Search
    CPC .... H10N 30/8554; H10N 30/87; H10N 30/01; H10N 30/50; H10N 30/05; B41J 2/14233; B41J 2/1607; B41J 2002/14266; B41J 2002/14258
    See application file for complete search history.

(56) References Cited

U.S. PATENT DOCUMENTS

| | | | |
|---|---|---|---|
| 2004/0238784 | A1 | 7/2004 | Heike |
| 2005/0035686 | A1 | 2/2005 | Florian |
| 2007/0262678 | A1* | 11/2007 | Kubota .............. H10N 30/8554 310/358 |
| 2009/0058955 | A1 | 5/2009 | Arakawa et al. |
| 2011/0259502 | A1* | 10/2011 | Schossmann ......... C04B 35/491 501/134 |
| 2012/0056507 | A1 | 3/2012 | Eggs et al. |
| 2012/0062075 | A1 | 3/2012 | Glazunov et al. |
| 2013/0038177 | A1 | 2/2013 | Glazunov et al. |
| 2013/0187516 | A1* | 7/2013 | Suenaga ............ H10N 30/8542 310/360 |
| 2014/0062255 | A1 | 3/2014 | Reed et al. |
| 2015/0194592 | A1 | 7/2015 | Aida et al. |
| 2015/0300894 | A1 | 10/2015 | Robutel |
| 2015/0333249 | A1 | 11/2015 | Moulard et al. |
| 2015/0364682 | A1 | 12/2015 | You et al. |
| 2016/0372653 | A1 | 12/2016 | Umeda et al. |
| 2018/0069528 | A1 | 3/2018 | Qiu et al. |

FOREIGN PATENT DOCUMENTS

| | | |
|---|---|---|
| CN | 102683577 A | 9/2012 |
| DE | 10 2011 083 543 A1 | 3/2013 |
| DE | 10201083543 | 3/2013 |
| EP | 2378579 A2 | 10/2011 |
| JP | 2001244516 A | 9/2001 |
| JP | 2007329460 A | 12/2007 |
| JP | 2009064859 A | 3/2009 |
| JP | 2009026994 A | 5/2009 |
| JP | 2011091234 A | 5/2011 |
| JP | 2014107563 | 6/2014 |
| WO | WO2013164955 | 11/2013 |
| WO | WO2014111481 | 7/2014 |

OTHER PUBLICATIONS

Park et al. "Stacking effect on the ferroelectric properties of PZT/PLZT multilayer thin films formed by photochemical metal-organic deposition" Applied Surface Science vol. 237, Issues 1-4, Oct. 15, 2004, pp. 427-432.

Li et al. "Comparison of the effect of PLT and PZT buffer layers on PZT thin films for ferroelectric materials applications" Applied Surface Science vol. 252, Issue 13, Apr. 30, 2006, pp. 4541-4544.

Liu et al. "Polarization correlation and pyroelectric properties of Pb(Zr, Ti)O3 and La doped Pb(Zr, Ti)O3 multilayer thin films" Integrated Ferroelectrics: an International Journal vol. 35, Issue 1-4, 2001 pp. 47-54.

The First Office Action dated Nov. 26, 2018, from the State Intellectual Property Office of People's Republic of China for corresponding Chinese Application No. 201580059541.4. (8 pgs.).

The Second Office Action dated Aug. 9, 2019, from the State Intellectual Property Office of People's Republic of China for corresponding Chinese Application No. 201580059541.4. (8 pgs.).

First Written Opinion from the Intellectual Property Office of Singapore dated Dec. 8, 2017, for corresponding Singaporean Application No. 11201703566U. (6 pgs.).

Second Written Opinion from the Intellectual Property Office of Singapore dated Nov. 7, 2018, for corresponding Singaporean Application No. 11201703566U. (6 pgs.).

The First Notice of Rejection dated Oct. 1, 2019, from the Japan Patent Office for corresponding Japanese Application No. 2017-542360 (11 pgs.).

Written Opinion for corresponding Singapore Application No. 11201703566U, dated Dec. 8, 2017.

Myers et al., "Layered Lead Zirconate Titanate and Lanthanum-Doped Lead Zirconate Titanate Ceramic Thin Films," J. Mater. Res., 17(9):2379-2385 (2002).

Peng et al., "Dielectric Enhancement of the Trilayered Bi3.1sNdo.ss Ti3O12/Bi3.1sEuo.ss Ti3O12 Thin Film Deposited on Pt/Ti/SiO2Si Substrate," J. Mater. Sci.:Mater Electron, 25:414-418 (2014).

Combined Search and Examination Report for Application No. GB1514653.3 dated Oct. 29, 2015.

International Search Report and Written Opinion for Application No. PCT/GB2015/053312, dated Feb. 9, 2016.

Examination Report for Application No. GB1514653.3 dated Jan. 29, 2017.

Notice of Reasons for Refusal dated Apr. 21, 2020 in Japanese Application No. 2017-542360 (5 pgs) and machine translations (5 pgs).

Third Office Action dated Mar. 23, 2020 in Chinese Application No. 201580059541.4 (7 pgs.) and machine translation (7 pgs).

* cited by examiner

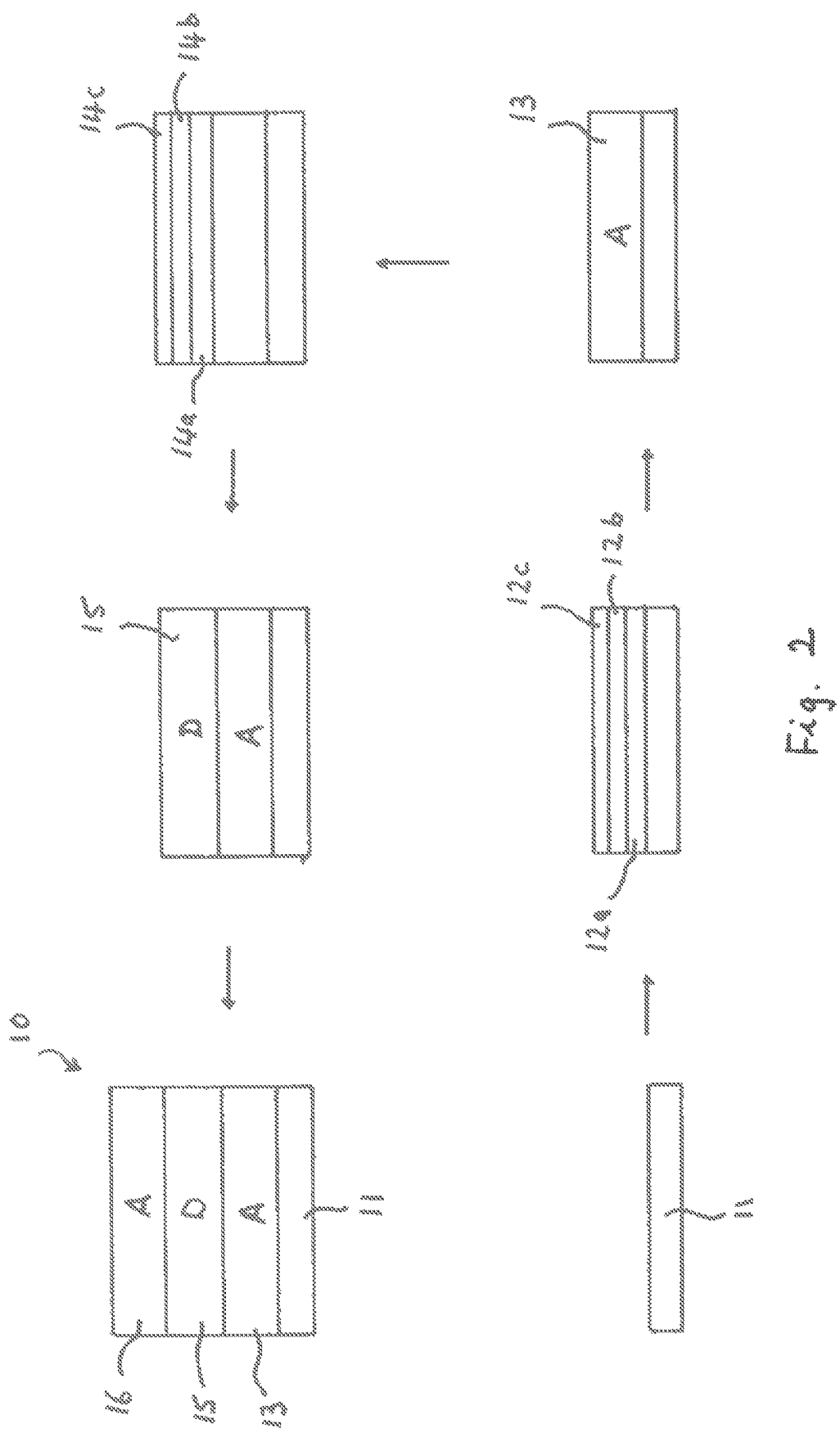

MULTILAYERED PIEZOELECTRIC THIN FILM ELEMENT

This application is a continuation of U.S. application Ser. No. 15/523,968, filed May 3, 2017, which is a National Stage Entry of International Application No. PCT/GB2015/053312, filed Nov. 4, 2015, which is based on and claims the benefit of priority under 35 U.S.C. § 119 to U.S. Provisional Application No. 62/075,153, filed Nov. 14, 2014. The entire contents of the above-referenced applications are expressly incorporated herein by reference.

The present invention is generally concerned with a piezoelectric thin film element suitable for use in actuators, sensors, energy harvesting devices and multilayer capacitors as well as a method of manufacturing the element. It is particularly, although not exclusively, concerned with a piezoelectric thin film element suitable for use as an actuator for a printhead in an ink-jet printer, as well as with actuators including the element, print heads including the actuator and ink-jet printers including the printheads.

A typical thin film piezoelectric element suitable for use as an actuator for a print head in an ink-jet printer comprises a metal or metal oxide bottom electrode formed on a substrate, a metal top electrode and a piezoelectric thin film interposed between the top and bottom electrodes.

The piezoelectric thin film may be formed by a variety of techniques including sputtering, physical vapour deposition (PVD), chemical vapour deposition (CVD), pulsed laser deposition (PLD) and atomic layer deposition (ALD) but it is conveniently formed by a chemical solution deposition process such as a sol-gel process or metallo-organic deposition (MOD). A sol-gel process is described in U.S. patent application 2003/0076007 A1 (incorporated by reference herein).

In a sol-gel process, a sol-gel solution is applied to a bottom electrode formed on a substrate, dried and then pyrolised to form a first precursor layer. The precursor layer is annealed by heating to form a first piezoelectric thin film layer. The sol-gel solution is then applied to the first layer, dried and pyrolised to form a second precursor layer. The second precursor layer is annealed by heating to form a second piezoelectric thin film layer. These latter steps are repeated so as to build up a laminate of piezoelectric thin film layers of desired thickness and then a top electrode is formed on the thin film (for example, by sputtering gold or iridium). The thicknesses of the thin film layers may be the same or different (as described in U.S. patent application 2003/0076007 A1).

The performance of a piezoelectric thin film element depends on a complex interplay of piezoelectric, electrical and mechanical properties of the element which can be difficult to balance.

In general, it is desired that the element is easily poled and shows a relatively large displacement response at conveniently applied electrical fields with good electrical properties such as low current leakage and high dielectric breakdown field.

It is further desired that the element shows good degradation performance viz. low electrical and mechanical performance losses over a large number of applications of these fields (cycles).

In many cases, the onset of degradation of a piezoelectric thin film typically begins after about $10^9$ cycles. A number of disclosures are specifically concerned with improving fatigue (or mechanical loss in performance prior to mechanical failure) in lead zirconate titanate (PZT) piezoelectric elements and some report an onset beyond $10^9$ cycles in monolayer films by lowering the applied voltage or by doping with a single dopant (for example, with $La^{3+}$ or $Nb^{5+}$).

The fatigue performance of six distinct PZT piezoelectric thin film elements comprising four thin film layers interposed between platinum and gold electrodes is reported by Meyers, T, Banerjee, P., Bose, S. and Bandyopadhyay, A. in J. Mater. Res, 2002, 17, 9, 2379-2385 (incorporated by reference herein).

A correlation is found between thin film elements having $La^{3+}$ doped (L) or undoped (P) thin film layers adjacent each electrode (LPPL and PLLP) and their end-layer monolithic counterparts (L, P). The middle layers (PP, LL) and the thicknesses of the layers are reported to have only a very small influence on the ferroelectric properties of the elements as compared to the influence of the end layers.

The present invention generally aims to provide a piezoelectric thin film element of improved piezoelectric and dielectric performance by exploiting complementary effects which are obtained in a piezoelectric thin film element which is doped by different dopants.

Accordingly, in a first aspect the present invention provides a piezoelectric thin film element having a first electrode, a second electrode and a piezoelectric thin film between the electrodes, wherein the thin film comprises a laminate having two or more piezoelectric thin film layers and wherein a first thin film layer is doped by one or more dopants and a second thin film layer is doped by one or more dopants and wherein at least one dopant of the second thin film layer is different from the dopant or dopants of the first thin film layer.

As used herein, a thin film comprising a laminate is a thin film which is formed layer-by-layer, in particular, by any of the aforementioned methods. The laminate may show defined interfaces between adjacent thin film layers (for example, when it is formed by a sol-gel process) or it may not show defined interfaces between adjacent thin film layers (for example, when it is formed by a PVD process.

The piezoelectric element may have an electrode configuration in which the piezoelectric thin film is interposed between the first and second electrodes. This configuration need not include any intermediate or other electrode—but other electrodes may be provided when, for example, a piezoelectric element comprising a stack of piezoelectric thin films is desired. Alternatively, the piezoelectric element may have an electrode configuration in which the first and second electrodes are provided on one surface of the piezoelectric thin film, for example, as an adjacent or interdigitated pair.

The dopants may be selected from the group of dopant types consisting of acceptor dopants, donor dopants and isovalent dopants.

In one embodiment, the thin film layers comprise crystals or crystallites based on metal oxides (for example, PZT) which have a perovskite crystal structure ($ABO_3$). In this embodiment, the dopants may notionally occupy the same or different co-ordination sites (A-site or B-site) in the perovskite crystal structure.

In particular, a first dopant may be a donor dopant which occupies the B-site (for example, $Nb^{5+}$) within the crystal structure and a second dopant may be an acceptor dopant which also occupies the B-site (for example, $Fe^{3+}$ or $Ni^{2+}$) within the crystal structure.

Alternatively, a first dopant may be a donor dopant which occupies the A-site (for example, $La^{3+}$) and a second dopant may be an acceptor dopant which occupies the B-site (for example, $Fe^{3+}$ or $Ni^{2+}$).

Alternatively, a first dopant may be a donor dopant which occupies the A-site (for example, $La^{3+}$) and a second dopant may be a donor dopant which occupies the B-site (for example, $Nb^{5+}$).

The laminate may further comprise one or more thin film layers which are undoped and/or one or more further thin film layers which are doped by one or more dopants which are the same as or different to the dopant or dopants of the first thin film layer and/or the dopant or dopants of the second thin film layer.

In one embodiment, the thin film element comprises a laminate having a first thin film layer which is singly doped by a first dopant and a second thin film layer which is singly doped by a second dopant which is different to the first dopant.

The second dopant may be of the same dopant type as the first dopant or it may be of a different dopant type to the first dopant.

The laminate may, in particular, comprise a first thin film layer which is singly doped by a first dopant of a first dopant type (for example, a donor dopant D) and a second thin film layer which is singly doped by a different, second dopant of the first dopant type (for example, a donor dopant D').

The laminate may comprise a first thin film layer which is singly doped by a dopant of a first dopant type (for example, a donor dopant D) and a second thin film layer is singly doped by a dopant of a different, second dopant type (for example, an acceptor dopant A).

In these embodiments, the laminate may further comprise one or more thin film layers which are undoped (P) or singly doped by a dopant of the first dopant type (same or different dopant to the first dopant) or singly doped by a dopant of the second dopant type (same or different dopant to the second dopant).

Alternatively or additionally, the laminate may further comprise one or more thin film layers which are singly doped by a dopant of a different dopant type to both the first and the second dopant types, for example, by an isovalent dopant (I).

Alternatively or additionally, the laminate may further comprise thin film layers which are doubly doped by dopants of the first and second dopant types (acceptor and donor dopants as compensating dopants).

The laminate may adopt any arrangement of doped thin film layers within these alternatives but it is preferred that they are alternately doped.

The laminate may, in particular, comprise two or more thin film layers which are alternately doped by dopants of the same dopant type (for example, $-D^1-D^2-D^1-D^2-$ in which $D^1$ and $D^2$ are different dopants) or two or more thin film layers which are alternately doped by dopants of different dopant types (for example, -A-D-A-D- in which A and D are different dopants).

The laminate may, in particular, comprise three, four, five, six or seven or more singly doped thin film layers in which any two adjacent thin film layers are singly doped by dopants of different dopant type (for example, -A-D-A-D-A-D-).

Alternatively or additionally, the laminate may comprise three or more singly doped thin film layers in which any one thin film layer which is doped is adjacent a thin film layer which is undoped and in which any two sequential thin film layers which are singly doped, are alternately doped by a dopant of a different dopant type (for example, -A-P-D-P-A-P-D-).

The laminate may also comprise four or more thin film layers in which a first series of adjacent thin film layers are singly doped by a dopant of a first dopant type and a second series of adjacent thin film layers are singly doped by a dopant of a second dopant type (for example, -A-A-D-D-). The laminate may include one or more additional series in which adjacent thin film layers are each singly doped by a dopant of the first dopant type or a dopant of the second dopant type (for example, -A-A-D-D-A-A-).

The series may or may not be separated from one another by an undoped thin film layer or by a doubly doped (A+D) thin film layer.

Of course, the arrangement of alternately doped thin film layers may be similar when one or other of the first thin film layer and the second thin film layer is doubly doped and/or the laminate comprises further thin film layers which are singly doped and further thin film layers which are doubly doped.

In particular, the laminate may comprise three, four, five, six or seven or more thin film layers in which any two adjacent thin film layers include a singly doped thin film layer and a doubly doped thin film layer and the doubly doped thin film layer includes a dopant of a different type to the singly doped thin film layer (for example, -A-A+D-A-A+D-A-A+D-).

Alternatively or additionally, the laminate may comprise three or more doped thin film layers in which any one thin film layer which is doubly doped is adjacent a thin film layer which is undoped and in which any two sequential thin film layers which are singly or doubly doped, are alternately doped and the doubly doped thin film layers include a dopant of a different type to the singly doped thin film layers (for example, -A+D-P-A+D-P-A+D-P-A+D-).

The laminate may also comprise four or more thin film layers in which a first series of adjacent thin film layers are doubly doped by dopants of a first dopant type and a second dopant type and a second series of adjacent thin film layers are singly doped by a dopant of the first dopant type (for example, -A+D-A+D-A+D-D-D-D-).

The series may or may not be separated from one another by an undoped thin film layer or by a singly doped thin film layer.

In one embodiment, the laminate provides that the first thin film layer is adjacent the first electrode and the second thin film layer is adjacent the second electrode. In this embodiment, a first dopant may be of the same or different dopant type to a second dopant and the laminate may include one or more thin film layers which separate the first and second thin film layers. The laminate may, in particular, comprise thin film layers which are alternately doped as described above.

The dopants may be chosen so that they provide complementary effects in the piezoelectric thin film element. The doping of thin film layers may, in particular, enable the properties of the element to be tuned for a particular application such as actuating (for example, in ink-jet printing), sensing and/or energy harvesting.

Donor doping at the A-site replaces $Pb^{2+}$ with a large trivalent ion (or at the B-site by pentavalent or hexavalent ion) and leads to cation vacancies at the A-site for charge compensation. Consequently, the domain walls are easier to move and a lower coercive field can often be applied to the element for poling. The piezoelectric thin film element typically shows better piezoelectric properties as compared with an element which is undoped as well as better DC electrical resistance, but dielectric losses due to domain wall motion are increased.

Acceptor doping at the B-site replaces $Ti^{4+}$ or $Zr^{4+}$ with a lower valent ion and leads to oxygen vacancies for charge compensation. The domain walls are more heavily pinned and often a higher coercive field has to be applied to the element for poling. The piezoelectric thin film element can show worse piezoelectric properties as compared with an element which is undoped and reduced DC electrical resistance but dielectric losses due to domain wall motion are lower.

Isovalent doping at the A-site or the B-site (for example, at the A-site by $Sr^{2+}$ or $Ba^{2+}$; at the B-site by $Hf^{4+}$ or $Sn^{4+}$) can broaden phase transitions and shift Curie temperatures so that the temperature dependence of the dielectric and piezoelectric response is changed.

Compensating doping at the B-site replaces $Ti^{4+}$ and $Zr^{4+}$ with a combination of donor and acceptor dopants (for example, $Mg^{2+}$ and $Sb^{5+}$ in mole ratio 1:2) and results in good properties of the thin film element along the morphotropic phase boundary.

The dopants may, in particular, be chosen to optimise piezoelectric properties against dielectric losses and/or breakdown strength in the piezoelectric thin film element. A thin film element doped by a donor dopant which occupies the A-site may provide a piezoelectric thin film element having better piezoelectric properties as compared to an undoped piezoelectric thin film element but at the disadvantage of having high dielectric losses. However, a thin film element doped by a donor dopant and an acceptor dopant may show better piezoelectric properties and low dielectric losses.

The dopants may, in particular, be chosen to optimise piezoelectric response against stability of the piezoelectric thin film element to high applied fields. A thin film element doped by a donor dopant may provide a large displacement at lower applied fields as compared to an undoped thin film element but the thin film element is less stable to high applied fields. However, a thin film element doped by a donor dopant and an acceptor dopant may provide a large displacement with comparable or better stability to high applied fields.

The dopants may, in particular, be chosen to optimise the mechanical robustness of the piezoelectric thin film element as well as its piezoelectric performance. A piezoelectric thin film element typically comprises first and second electrodes which are the same or different to one another and dopants can be chosen for one or both of the thin film layers adjacent the electrodes so as to optimise the mechanical robustness of the interface with the electrode and/or to minimise charge injection from the electrode to the piezoelectric thin film element.

The dopants may, in particular, be chosen to relieve internal stress in the piezoelectric thin film element by providing a gradient in mechanical, piezoelectric or electrical properties within the element.

The laminate may comprise two or more thin film layers (for example, at least three, four, five thin film layers) which define a gradient in dopant concentration across thin film layers. In the arrangements of alternately doped thin film layers described above, the gradient concentration may be defined in a first dopant type across singly doped and/or doubly doped thin film layers.

In one embodiment, the laminate comprises two, three, four or more thin film layers which are singly doped by a dopant of a first dopant type and/or two, three, four or more thin film layers which are singly doped by a dopant of a second type so that similarly doped thin film layers define a gradient in dopant concentration across thin film layers (for example -$A_i$-$A_2$-$A_3$-$D_i$-$D_2$-$D_3$-).

The dopant concentration may increase or decrease from the first electrode to the second electrode. Alternatively, the dopant concentration may increase from the first electrode and decrease to the second electrode. The gradient may be constant or it may increase and/or decrease with dopant concentration (for example, in the same way as described for dopant concentration).

In one embodiment, the thin film layers are sol gel derived and one or more doped thin film layers define a gradient in dopant concentration within the thin layer. In this embodiment, the dopants should show very low mobility during annealing.

Suitable piezoelectric materials, dopants and dopant precursors for the present invention will be apparent to those skilled in the art. Preferred piezoelectric materials include PZT and lead-free alternatives including, for example, potassium sodium niobate (KNN) and those of binary or tertiary composition known in the art as BNT-BT, BKT-BNT, BKT-BZT, BKT-BNT-BZT and BKT-BNT-BT.

The dopants may, in particular, be any of those mentioned above. Other suitable donor dopants include $Ta^{5+}$, $V^{5+}$, $U^{5+}$, $W^{6+}$ and divalent or trivalent ions of the alkaline earth and rare earth elements. Other suitable acceptor dopants include $Na^+$, $K^+$, $Cs^+$ and $Rh^+$ as well as $Cr^{3+}$, $Li^+$, $Co^{2+}$, $Ni^{2+}$, $Cu^{2+}$, $Cu^+$, $Y^{3+}$ and $Ti^{4+}$, $Zr^{4+}$ and $Sn^{4+}$.

In one embodiment in which all the thin film layers comprise singly doped PZT, the different dopants are $Mn^{2+}$ or $Mn^{3+}$ or $Mn^{4+}$ and $Nb^{5+}$ or $Hf^{4+}$.

The concentration of dopant in a thin film layer may be between 0.1 to 10.0 mole %. In particular, it may be between 0.1 mole % and 3.0 mole %, for example, 0.5 mole % 1.0 mole %, 1.5 mole %, 2.0 mole % or 2.5 mole %.

The thickness of each thin film layer in the laminate may be between 5 nm and 300 nm. In one embodiment, the thickness of the thin film layer adjacent the first electrode or the second electrode is between 10 and 100 nm and the thickness of each of the other thin film layers is between 100 nm and 300 nm.

The thickness (t) of each thin film layer may be chosen so that a plurality of thin film layers define a gradient in thicknesses (for example, $t_i > t_2 > t_3$) across thin film layers. In one embodiment, the gradient in thicknesses may complement a gradient in dopant concentrations across thin film layers. The gradient may, in particular, reinforce or oppose the gradient in dopant concentration across thin film layers.

The first electrode and the second electrode may be a metal and/or a metal oxide electrode as is known to the art. For example, the first electrode may be platinum, copper, nickel, gold. It may be iridium or an iridium-iridium dioxide composite. It may alternatively be lanthanum nickel oxide or strontium ruthenate.

In some embodiments, the first electrode or the second electrode may include a seed layer. The seed layer can control the crystal orientation of the thin film layers and may comprise any that are known to the art for that purpose, in particular, titanium dioxide, strontium ruthenate, lead titanium oxide or lanthanum nickel oxide.

In preferred embodiments of the present invention, the piezoelectric thin film comprises piezoelectric thin film layers which are all sol-gel derived thin film layers.

In a second aspect, the present invention provides a method for manufacturing a piezoelectric thin film element having a first electrode, a second electrode and a piezoelectric thin film between the electrodes, which method comprises a first step of forming a piezoelectric thin film layer on an electrode and one or more further steps of forming a piezoelectric thin film layer on the thin film layer whereby to form a laminate comprising a plurality of piezoelectric thin film layers wherein a first thin film layer is doped by one or more dopants and a second film layer is doped by one or more dopants and wherein at least one dopant of the second thin film layer is different from the dopant or dopants of the first thin film layer.

The method may provide a piezoelectric element having an electrode configuration in which the piezoelectric thin film is interposed between the first and second electrodes. This configuration does not include an intermediate or other electrode when the laminate comprises only piezoelectric thin film layers. Alternatively, the method may provide a piezoelectric element having an electrode configuration in which the first and second electrodes are provided on one surface of the piezoelectric thin film, for example, as an adjacent or interdigitated pair.

The method may comprise forming the piezoelectric thin film layers by any of the processes known to the art including sputtering, physical vapour deposition (PVD), chemical vapour deposition (CVD), pulsed laser deposition (PLD) and atomic layer deposition (ALD) but it is conveniently formed by a chemical solution deposition process such as a sol-gel process or metallo-organic deposition (MOD).

It is preferred, therefore, that the method comprises a sol-gel process. In a preferred embodiment, the present invention provides a method for manufacturing a piezoelectric thin film element having a first electrode, a second electrode and a piezoelectric thin film between the electrodes which method comprises a first step of depositing one or more precursor layers onto an electrode and annealing the precursor layer or layers to form a piezoelectric thin film layer and one or more further steps of depositing one or more precursor layers onto the thin film layer and annealing the precursor layer or layers to form a laminate comprising a plurality of piezoelectric thin film layers wherein the one or more precursor layers in each step are doped or undoped so that the laminate comprises a first thin film layer doped by one or more dopants and a second thin film layer doped by one or more dopants and wherein at least one dopant of the second thin film layer is different from the dopant or dopants of the first thin film layer.

In this embodiment, the method comprises depositing the precursor layers by applying a sol-gel solution onto an electrode provided on a substrate or thin film layer followed by drying and pyrolysis. The number of precursor layers in any one step may, in particular, be one, two, three or four precursor layers.

The sol-gel solution can be applied by spin-coating or dip-coating but any of the coating techniques known to the art may also be used. In one embodiment, the drying comprises heating to a temperature of between 100° C. and 250° C., for example between 100° C. and 150° C. and the pyrolysis comprises heating to a temperature of between 200° C. and 500° C., for example between 200° C. and 400° C. and in particular, to 350° C.

The method may comprise forming thin film layers comprising a crystal or crystallites based on metal oxides and having a perovskite crystal structure ($AB0_3$). The crystal or the crystallites may, in particular, comprise PZT and/or PZT doped by any one of $Mn^{2+}$ or $Mn^{3+}$ or $Mn^{4+}$ and $Nb^{5+}$ or $Hf^{4+}$.

In the preferred embodiment, the method comprises annealing the precursor layers by heating from below the substrate to a temperature between 550° C. and 800° C., for example between 600° C. and 800° C. and, in particular, to 700° C. This heating, which may be accomplished by rapid thermal processing (RTP), results in very good columnar growth of crystallites and well-defined grain boundaries between grains.

The dopants may be selected from the group of dopant types consisting of acceptor dopants, donor dopants and isovalent dopants.

In one embodiment, the first and further steps forms thin film layers in which the dopants notionally occupy the same or different co-ordination sites (A or B) in the perovskite crystal structure (see above).

The first and further steps may provide a laminate comprising further thin film layers which are undoped. They may alternatively or additionally provide a laminate comprising further thin film layers which are doped by one or more dopants which are the same as or different to the dopant or dopants of the first thin film layer and/or the dopant or dopants of the second thin film layer.

In one embodiment, the first and further steps may form a laminate comprising a first thin film layer which is singly doped by a first dopant and a second thin film layer which is singly doped by a second dopant which is different to the first dopant.

The second dopant may be of the same dopant type as the first dopant or it may be of a different dopant type to the first dopant.

The first and further steps may provide a laminate comprising a first thin film layer which is singly doped by a dopant of a first dopant type (for example, a donor dopant D) and a second thin film layer which is singly doped by a different, second dopant of the first dopant type (for example, a donor dopant D).

The first and further steps may also provide a laminate comprising a first thin film layer which is singly doped by a dopant of a first dopant type (for example, a donor dopant D) and the second thin film layer which is singly doped by a dopant of a different, second dopant type (for example, an acceptor dopant A).

In these embodiments, the first and further steps may also provide a laminate further comprising one or more thin film layers which are either undoped (P) or singly doped by a dopant of the first dopant type (same or different dopant to the first dopant) or singly doped by a dopant of the second dopant type (same or different dopant to the second dopant).

Alternatively, or additionally, the first and further steps may provide a laminate further comprising thin film layers which are singly doped by a dopant of a different dopant type to both the first and the second dopant types.

Alternatively or additionally, the first and further steps may provide a laminate further comprising thin film layers which are doubly doped by dopants of the first and second dopant types (as compensating dopants).

The first and further steps may provide any arrangement of doped and/undoped layers within these alternatives but it is preferred that they are alternately doped by the same or different dopant types.

The first and further steps may provide a laminate comprising two or more thin film layers which are alternately doped by dopants of the same dopant type (for example, -$D^1$-$D^2$-$D^1$-$D^2$- in which $D^1$ and $D^2$ are different dopants) or two or more thin film layers which are alternately doped by dopants of different dopant type (for example, -A-D-A-D- in which A and D are different dopants).

The first and further steps may provide a laminate comprising three or more singly doped thin film layers in which any two adjacent thin film layers are alternately doped by dopants of a different dopant type (for example, -A-D-A-D-A-D-).

Alternatively or additionally, the first and further steps may form a laminate comprising three or more singly doped thin film layers in which any one thin film layer which is doped is adjacent a thin film layer which is undoped and in which any two sequential thin films which are doped, are alternately doped by a dopant of a different dopant type (for example, -A-P-D-P-A-P-D-).

The first and further steps may also provide a laminate comprising four or more thin film layers in which a first series of adjacent thin film layers are doped by a dopant of a first dopant type and a second series of adjacent thin film layers are doped by a dopant of a second dopant type (for example, -A-A-D-D-). This laminate may include one or more additional series in which adjacent thin film layers are singly doped by a dopant of the first dopant type or the dopant type (for example, -A-A-D-D-A-A-). The series may or may not be separated from one another by one or more undoped or doubly doped thin film layers.

Other embodiments of the method will be apparent from the description of the laminate in which one or other of the first thin film layer and the second film layer is doubly doped and/or the laminate comprises further thin film layers which are undoped or singly doped.

The first and further steps may provide a laminate of any appropriate thickness (for example, about 1 μηι) having any number of thin film layers (for example, four, eight, ten, twelve, fourteen, sixteen or more).

The first and further steps may provide a laminate in which the first thin film layer is adjacent the first electrode and the second thin film layer s adjacent the second electrode. Here, the first dopant may be of the same or different dopant type as the second dopant and the laminate may include additional thin film layers which separate the first and second thin film layers. The first and further steps may form a laminate such as this in which thin film layers are alternately doped as described above.

In one embodiment, the first and further steps provide a laminate in which two or more thin film layers define a gradient in dopant concentration across thin film layers. In the arrangements of alternately doped thin film layers described above, the gradient concentration may be defined in a first dopant type across singly doped and/or doubly doped thin film layers.

In one embodiment, the first and further steps provide a laminate comprising two, three, four or more thin film layers which are doped by a dopant of a first dopant type and/or two, three, four or more thin film layers which are doped by a dopant of a second dopant type so that similarly doped thin film layers define a gradient in dopant concentration across thin film layers (for example -A1-A2-A3-D1-D2-D3-).

In this embodiment, the method may comprise depositing one or more precursor layers doped by the first dopant (or a dopant of a first dopant type) at a first concentration and annealing the precursor layers to form a first doped thin film layer and depositing one or more precursor layers doped by the first dopant (or dopant of a first dopant type) at a second concentration which is different from the first concentration and annealing the precursor layers to form a second doped thin film layer.

Of course, the method may further comprise depositing one or more precursor layers doped by the first dopant (or dopant of a first dopant type) at a third concentration and annealing the precursor layers to form a third piezoelectric thin film layer and so on. The third and subsequent concentrations may, however, be the same or different to the first concentration.

The first and further steps may provide a laminate in which in dopant concentration increases or decreases from the first electrode to the second electrode. Alternatively, they may form a laminate in which dopant concentration increases from the first electrode and decreases to the second electrode. The gradient may be constant or it may increase and/or decrease with dopant concentration (for example, in the same way as described for dopant concentration).

In the preferred embodiment, the first and further steps may form one or more thin film layers which define a gradient in dopant concentration within the thin layer.

In this embodiment, the method may comprise depositing a first precursor layer doped by a first dopant at a first concentration followed by depositing on the first precursor layer a second precursor layer doped by the first dopant but at a second concentration which is different from the first concentration and annealing the precursor layers to form the first thin film layer.

Of course, the method may comprise depositing third and fourth precursor layers doped by the first dopant before the annealing. The concentration of the first dopant in the third and fourth precursor layers may, however, be the same or different to the concentration of the first dopant in the first precursor layer. In any case, dopants should show low mobility during annealing to form the thin film layer.

In one embodiment, the first and further steps may provide a laminate comprising a plurality of thin film layers defining a gradient in thin film layer thickness (t) across thin film layers (for example, $ti > t_2 > t_3$). The gradient may complement a gradient in dopant concentrations across thin film layers. The gradient in thickness may, in particular, reinforce or oppose the gradient in dopant concentration across similarly doped thin film layers.

In this embodiment, the method may comprise depositing one or more precursor layers and annealing the precursor layers to form a first thin film layer having a first thickness and depositing one or more precursor layers to form a second thin film layer having a second thickness which is different from the first thickness.

Of course, the number of precursor layers may be used to control the thickness of a thin film layer and the method may further comprise depositing one or more precursor layers and annealing the precursor layers to form a third thin film layer having a third thickness and so on. The third and subsequent thicknesses may be the same or different to the first thickness.

The first electrode and the second electrode may be a metal and/or a metal oxide electrode as is known to the art. For example, the first electrode may be platinum, copper, nickel, gold, it may be iridium or an iridium-iridium dioxide composite. It may alternatively be lanthanum nickel oxide or strontium ruthenate.

In some embodiments, the first electrode or the second electrode may be provided with a seed layer. The seed layer can control crystal orientation and may comprise any that are known to the art for that purpose, for example, titanium dioxide, strontium ruthenate or lanthanum nickel oxide. In these embodiments, the method comprises a first step of depositing one or more precursor layers onto the seed layer.

In a third aspect, the present invention provides an actuator for a printhead, which actuator comprises a piezoelectric element according to the first aspect.

In a fourth aspect, the present invention provides a printhead, comprising the actuator according to the third aspect.

In a fifth aspect, the present invention provides an ink-jet printer, comprising the printhead according to the fourth aspect.

Embodiments of the actuator, printhead and ink-jet printer will be apparent from the first and second aspects of the invention.

The present invention is disclosed in more detail as follows and with reference to certain non-limiting embodiments and the accompanying Drawings in which:

FIG. 2 is a scheme illustrating in section view one embodiment of the method of the present invention;

FIG. 6 is a section view illustrating still another embodiment of the piezoelectric thin film element of the present invention;

Figure 1:
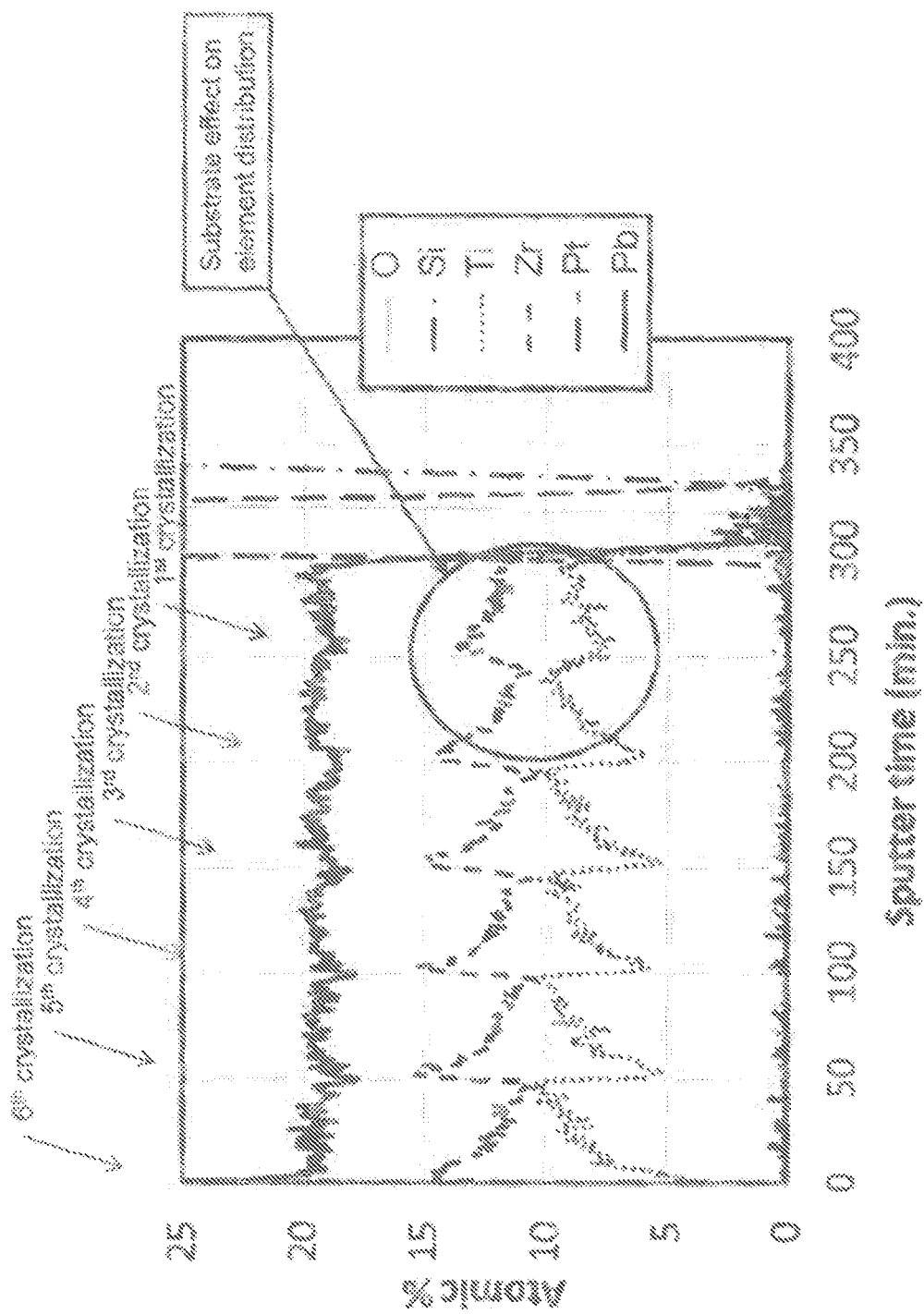
FIG. 1 is a graph showing a depth profile obtained by X-ray photoelectron spectroscopy of a 1 μm PZT film disposed on a platinum electrode over a silicon dioxide substrate provided with a zinc tin oxide adhesion layer (PZT/Pt/ZTO/SiO$_2$)

FIG. 1 shows a graph reporting the result of an X-ray photoelectron spectroscopy experiment examining the depth profile of the concentration of elements within a PZT thin film of 1 μm on a platinum electrode provided on a glass substrate. The thin film is formed by depositing a precursor layer and annealing the precursor layer by heating from below the electrode and repeating these steps to form a laminate of six crystallised thin film layers.

The graph plots the elemental composition in the thin film against sputter time (increasing depth of penetration of incident radiation).

As may be seen, the $Ti^{4+}$ concentration and the $Zr^{4+}$ concentration within the thin film follows a profile (circled) which is consistent with faster crystallisation of lead titanate as compared to lead zirconate and is repeated throughout the film in a number corresponding to the number of crystallised thin layers.

The graph shows not just six distinct crystallisations but also that the $Ti^{4+}$ concentration and the $Zr^{4+}$ concentration within a first crystallised thin film layer is unaltered by repeated annealing to form subsequent crystallised thin film layers.

In other words, there is no migration of $Ti^{4+}$ or $Zr^{4+}$ between layers during the formation of one or more crystallised thin film layers on an already formed crystallised thin film layer.

Referring now to FIG. 2, there is shown a scheme illustrating a method for manufacturing a piezoelectric thin film element 10 according to one embodiment of the present invention.

A sol-gel layer comprising appropriate amounts of PZT and acceptor dopant precursor is provided to an upper surface of an electrode 11 (for example, of lanthanum niobate) provided on a silicon substrate by spin coating. The sol-gel layer is dried by heating the substrate and sol-gel layer to a temperature of between 120° C. and 150° C. After cooling, the dried layer is pyrolised by heating the substrate and dried layer to a temperature of about 350° C. to provide an amorphous precursor layer 12a.

The spin coating, drying and pyrolysis are repeated so as to provide further amorphous precursor layers 12b and 12c on the substrate.

After cooling, the substrate and the three precursor layers are heated rapidly to a temperature of about 700° C. by placing the substrate on or above a hot plate. The below substrate heating anneals the three precursor layers into a first thin film layer 13 comprising crystallites of PZT doped by an acceptor dopant (A, for example, $Mn^{2+}$ at the B-site).

After cooling, a sol-gel layer comprising appropriate amounts of PZT and donor dopant precursor is provided to the thin film layer 13 on the substrate and dried and pyrolised as before to provide a precursor layer 14a on the thin film layer.

The spin coating, drying and pyrolysis are repeated so as to provide further amorphous precursor layers 14b and 14c on the substrate.

The substrate and its layers are again rapidly heated to a temperature of about 700° C. by placing the substrate on or above a hot plate. The below substrate heating anneals the precursor layers into a second thin film layer 15 comprising crystallites of PZT doped by a donor dopant (D, for example $Nb^{5+}$, at the B-site or $La^{3+}$ at the A-site).

A sol-gel layer comprising appropriate amounts of PZT and donor dopant precursor is provided to the thin film layer 15 by spin-coating, drying and pyrolysis in the same way it is applied to the electrode. The precursor layers are annealed into a thin film layer 16 comprising crystallites of PZT doped by an acceptor dopant (A, for example, $Mn^{2+}$ at the B-site).

The cycle can be repeated for so as to provide a laminate of desired thickness (for example, 1 μm) comprising alternately doped PZT thin film layers (sixteen for example). Of course, the process may use a sol-gel solution without a dopant precursor so that the laminate includes one or more undoped thin film layers of crystallites of PZT.

Finally an electrode (not shown in FIGS. 2 to 10, for example of gold metal) is formed by sputtering (for example) on to the top thin film layer.

In this embodiment, the first thin film and the third thin film layer may be doped by an acceptor dopant (A, for example, $Mn^{2+}$, at the B-site) and the second thin film layer may be doped by a donor dopant (D, for example $Nb^{5+}$, at the B-site or $La^{3+}$ at the A-site).

In another embodiment (not shown), the first thin film layer is undoped, the second thin film layer is doped by a donor dopant (D, for example $Nb^{5+}$, at the B-site or $La^{3+}$ at the A-site) and the third thin film layer is doped by an acceptor dopant (A, for example, $Mn^{2+}$, at the B-site).

Figure 3:
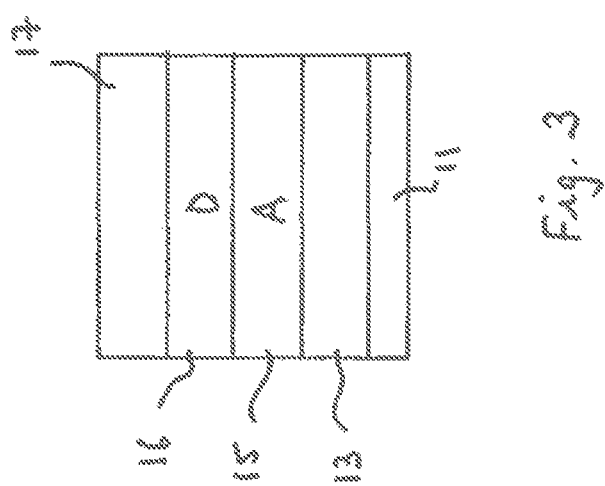
FIG. 3 is a section view illustrating one embodiment of the piezoelectric thin film element of the present invention.

FIG. 3 shows an embodiment of the present invention having four thin film layers. The first thin film layer 13 and the fourth thin film layer 17 are undoped whilst the second thin film layer 15 is doped by an acceptor dopant (A, for example, $Mn^{2+}$, at the B-site) and the third thin film layer 16 is doped by a donor dopant (D, for example $Nb^{5+}$, at the B-site or $La^{3+}$ at the A-site).

Figure 4:
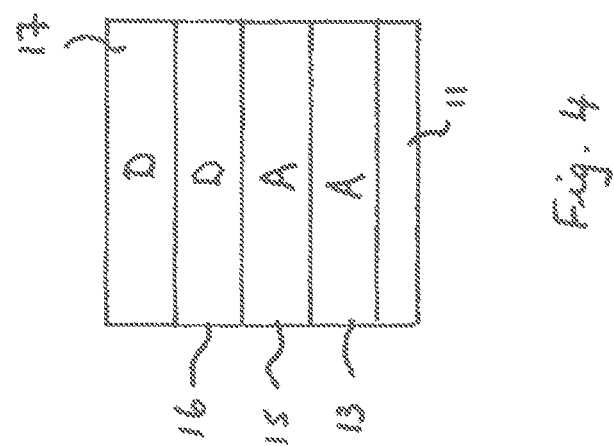
FIG. 4 is a section view illustrating another embodiment of the piezoelectric thin film element of the present invention.

FIG. 4 shows an embodiment of the present invention also having four thin film layers. The first thin film layer 13 and the second thin film layer 15 are doped by acceptor dopants (A, for example, $Mn^{2+}$, at the B-site) whilst the third thin film layer 16 and the fourth thin film layer 17 are doped by donor dopants (D, for example $Nb^{5+}$ at the B-site or $La^{3+}$ at the A-site).

Figure 5:
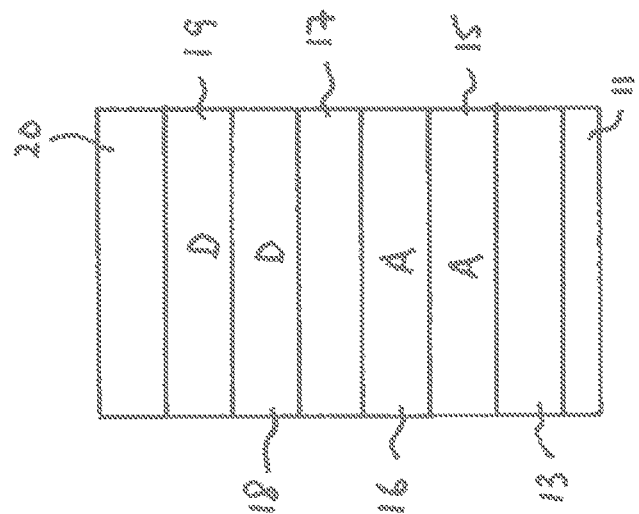
FIG. 5 is a section illustrating a further embodiment of the piezoelectric thin film element of the present invention.

FIG. 5 shows an embodiment of the present invention having seven thin film layers. The thin film layers 13 to 20 are alternately doped by donor dopant and acceptor dopant. In particular, the first, third, fifth and seventh thin film layers 13, 16, 18, 20 are doped by an acceptor dopant (A, for example, $Mn^{2+}$, at the B-site) and the second, fourth and sixth thin film layers 15, 17, 19 are doped by a donor dopant (D, for example $Nb^{5+}$ at the B-site or $La^{3+}$ at the A-site).

FIG. 6 shows an embodiment of the present invention also having seven thin film layers. The thin film layers include a series of layers which are similarly doped. The first thin film layer 13 and the fourth and seventh thin film layers 17, 20 are undoped whilst the second and third thin film layers 15, 16 are doped by an acceptor dopant (A, for example, $Mn^{2+}$, at the B-site) and the fifth and sixth thin film layers 18, 19 are doped by a donor dopant (D, for example $Nb^{5+}$, at the B-site or $La^{3+}$ at the A-site).

Figure 7:
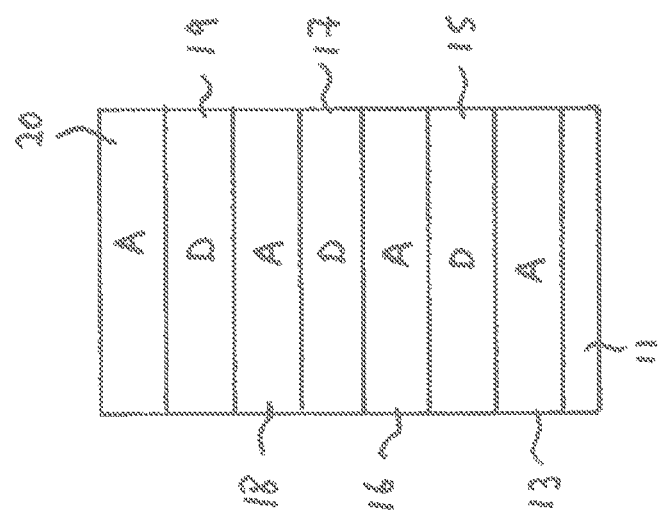
FIG. 7 is a section view illustrating still another embodiment of the piezoelectric thin film element of the present invention.
Figure 7:
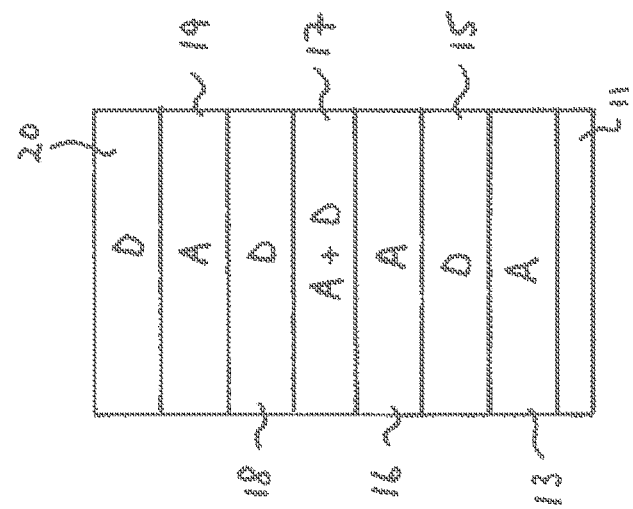

FIG. 7 shows an embodiment of the present invention also having seven thin film layers. The thin film layers are alternately doped with donor dopant and acceptor dopant. In particular, the first, third and sixth thin film layers 14, 16, 19 are doped by an acceptor dopant (A, for example, $Mn^{2+}$, at the B-site). The second, fifth and seventh thin film layers 15, 18, 20 are doped by a donor dopant (D, for example $Nb^{5+}$, at the B-site or $La^{3+}$ at the A-site) whilst the fourth thin film layer 17 is doped by compensating dopants comprising a combination of acceptor and donor dopants (A and D, for example, $Mg^{2+}$ and $Sb^{5+}$ in molar ratio 1:2 or $Ni^{2+}$ and $Nb^{5+}$ in molar ratio 1:2 or $Mg^{2+}$ and $W^{6+}$ in molar ratio 1:1).

Figure 8:
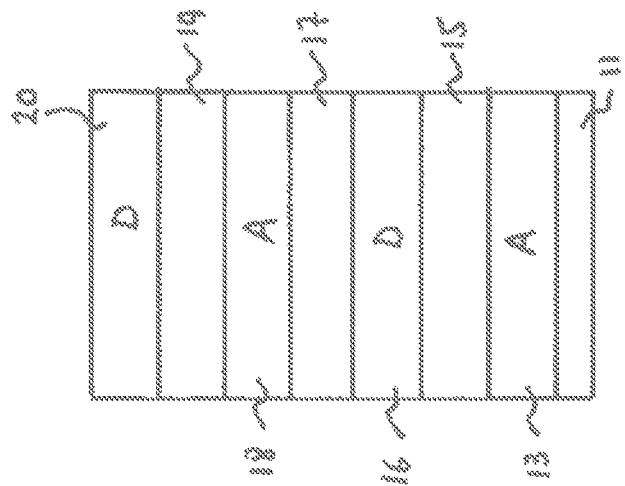
FIG. 8 is a section view illustrating still another embodiment of the piezoelectric thin film element of the present invention.

FIG. 8 shows an embodiment of the present invention also having seven thin film layers. In this embodiment, the thin film layers are alternately doped but have an intervening undoped layer. In particular, the first thin film layer 13 and the fifth thin film layer 18 are doped by an acceptor dopant, the third and seventh thin film layers 16, 20 are doped by a donor dopant and the second, fourth and sixth thin film layers 15, 17, 19 are undoped.

Figure 9:
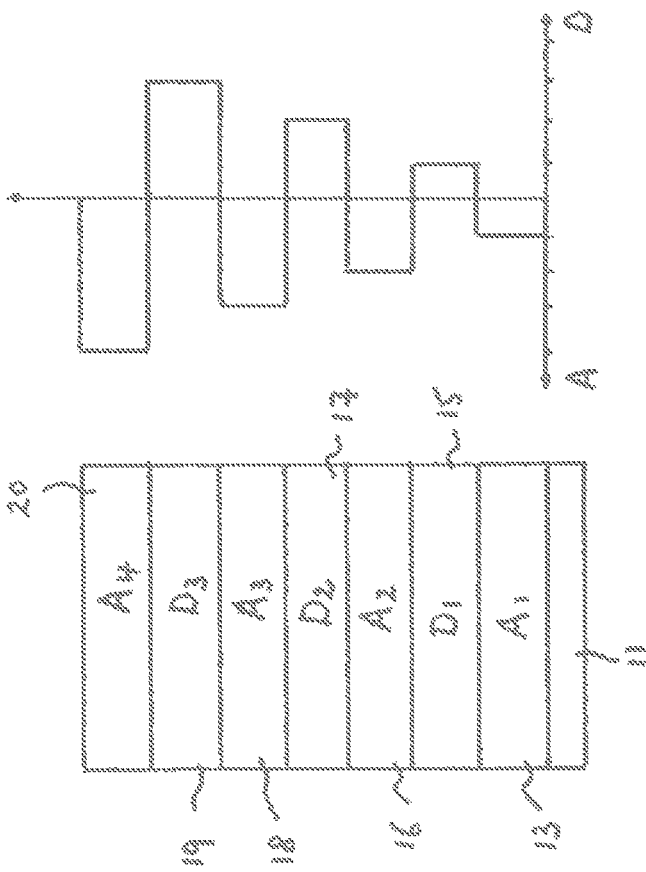
FIG. 9 is a section view illustrating an embodiment of the piezoelectric thin film element of the present invention and a graph showing a gradient in dopant concentration across the layers.

FIG. 9 shows a similar embodiment to that shown in FIG. 5. In this embodiment, however, the concentration of dopant in each thin film layer doped by an acceptor dopant differs and increases toward the seventh layer ($A_i$ to $A_4$). The concentration of dopant in each thin film layer doped by a donor dopant increases toward the seventh layer ($D_i$ to $D_3$). The accompanying graph (ordinate axis 0.5 mole % increments) particularly points out acceptor and donor dopant concentrations which increase from 0.5 mole % to 2.0 mole % or from 0.5 mole % to 1.5 mole %.

Figure 10:
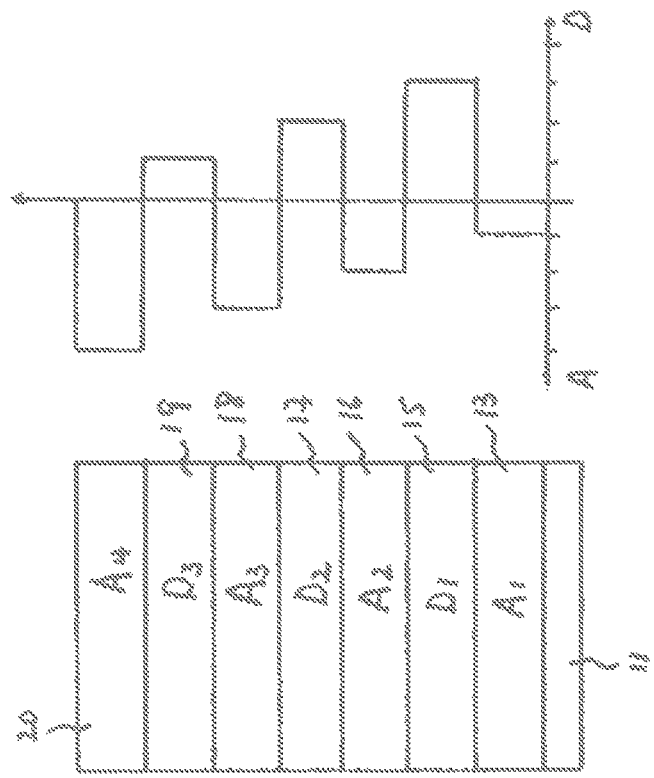
FIG. 10 is a section view illustrating another embodiment of the piezoelectric thin film element of the present invention and a graph showing another gradient in dopant concentration across the layers.

FIG. 10 also shows a similar embodiment to that shown in FIG. 5. In this embodiment, however, the concentration of dopant in each thin film layer doped by the acceptor dopant differs and increases towards the seventh layer. The concentration of dopant in each thin film layer doped by the donor dopant decreases to toward the seventh layer ($D_i$ to $D_3$). The accompanying graph (ordinate axis 0.5 mole % increments) particularly points out acceptor dopant concentrations ($A_1$ to $A_3$) which increase from 0.5 mole % to 2.0 mole % and donor dopant concentrations which decrease from 1.5 mole % to 0.5 mole %.

Figure 11:
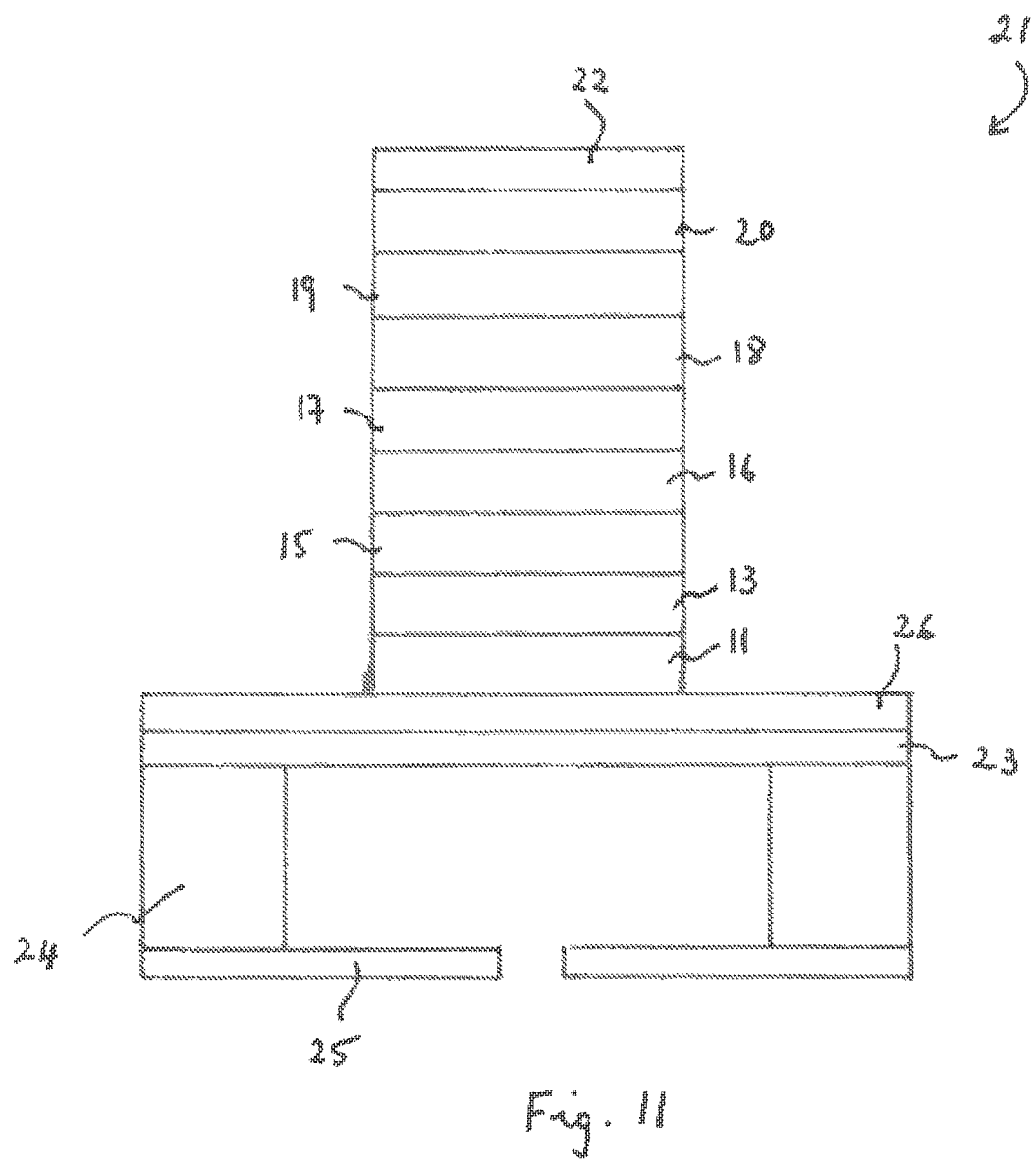
FIG. 11 is a section view of a drop ejector portion of an ink-jet printhead showing use of one embodiment of the piezoelectric thin film of the present invention as an actuator.

FIG. 11 shows a section view of an ink-jet printhead 21 according to one embodiment of the present invention. A piezoelectric thin film element 10 comprising first and second electrodes 11 and 22 having a piezoelectric thin film comprising a laminate of seven thin film layers interposed between the electrodes is provided to a diaphragm 23 on top of a pressure chamber 24, provided with a nozzle plate 25.

The pressure chamber 24 may comprise a silicon single crystal of thickness about 200 μη and the diaphragm may comprise a thin film comprising one or more of silicon dioxide, zirconium oxide, tantalum oxide, and silicon nitride or aluminium oxide.

A buffer layer 26 of ultra-thin titanium film or chromium film (about 10 nm thickness) is interposed between the diaphragm and the first electrode.

In use, a predetermined drive voltage is applied between the first and second electrodes by a signal from a control circuit. The voltage causes the piezoelectric thin film element 10 to deform so deflecting the diaphragm 23 into the pressure chamber 24 and changing its volume. A sufficient increase in pressure within the pressure chamber causes ink droplets to be ejected from the nozzle.

The present invention has been described in detail with reference to certain embodiments which are illustrated by the drawings. However, it will be understood that other embodiments not described in detail or illustrated by the drawings are also included within the scope of the present invention.

It will be appreciated that similar alternate arrangements are possible in singly doped thin film layers doped by two different donor dopants or by two different acceptor dopants (for example, doping at the A-site and the B-site) or by a plurality of donor dopants including different dopants or by a plurality of different acceptor dopants including different dopants.

It will also be appreciated that the first thin film layer and the second thin film layer may be triply doped or doped by four or more dopants. And that laminates comprising any reasonable combination of thin film layers which are undoped, singly doped and triply doped or doped by four or more dopants are possible.

The invention claimed is:

1. A piezoelectric thin film element comprising:
   a first electrode;
   a second electrode; and
   a piezoelectric thin film having a perovskite $ABO_3$ crystal structure, the piezoelectric thin film being arranged between the first and second electrodes and in contact with the first and second electrodes,
   wherein
      the piezoelectric thin film comprises a laminate having two or more piezoelectric thin film layers and wherein a first thin film layer is singly doped by a first donor dopant and a second thin film layer is singly doped by a second dopant selected from one of dopant type consisting of one of donor dopants, acceptor dopants and isovalent dopants, wherein the second dopant is different from the first donor dopant; and
      the piezoelectric thin film is configured to be deformed upon application of a predetermined drive voltage between the first and second electrodes.

2. The piezoelectric thin film element according to claim 1, in which the second dopant is selected from the dopant type consisting of acceptor dopants.

3. The piezoelectric thin film element according to claim 1, wherein the first donor dopant is one of $Nb^{5+}$ and $Hf^{4+}$ and the second dopant is one of $Mn^{2+}$, $Mn^{3+}$, and $Mn^{4+}$.

4. The piezoelectric thin film element according to claim 1, in which all thin film layers comprise lead zirconate titanate (PZT).

5. The piezoelectric thin film element according to claim 1, in which the first dopant and the second dopant occupy the same or different co-ordination sites (A-site or B-site) in the perovskite $ABO_3$ crystal structure.

6. The piezoelectric thin film element according to claim 1, wherein:
   the laminate comprises at least three piezoelectric thin film layers;
   the laminate comprises one thin film layer which is undoped and contact the first electrode and the first thin film layer.

7. The piezoelectric thin film element according to claim 1, wherein:
   the laminate comprises at least three piezoelectric thin film layers; and
   a third film layer comprises the first dopant of the first thin film layer and the second dopant of the second thin film layer.

8. The piezoelectric thin film element according to claim 1, in which the first donor dopant and the second dopant are of a different dopant type.

9. The piezoelectric thin film element according to claim 1, in which the laminate comprises one or more further thin film layers which are singly doped by dopants of the same or different dopant type.

10. The piezoelectric thin film element according to claim 1, in which the laminate comprises two or more thin film layers which are alternately doped by the first donor dopant and a second donor dopant or by the first donor dopant and a dopant of a second dopant type.

11. The piezoelectric thin film element according to claim 10, in which any two adjacent thin film layers are alternately doped by the first donor dopant and a dopant of the second dopant type.

12. The piezoelectric thin film element according to claim 10, wherein:
   one thin film layer which is doped is adjacent a thin film layer which is undoped or doped and any two sequential thin film layers which are doped, are alternately doped by the first donor dopant and a dopant of a second dopant type; and
   the doping concentration of the thin film layers decreases towards the first electrode.

13. The piezoelectric thin film element according to claim 10, wherein:
   the laminate comprises a plurality of piezoelectric thin film layers;
   a first series of adjacent thin film layers which are doped by the first donor dopant and a second series of adjacent thin film layers which are doped by a dopant of a second dopant type, the second dopant type being an acceptor donor dopant;
   the concentration of the acceptor dopant in thin film layers decreases towards the first electrode; and
   the concentration of the first donor dopant increases towards the first electrode.

14. The piezoelectric thin film element according to claim 10, in which similarly doped thin film layers define a gradient in dopant concentration across thin film layers.

15. The piezoelectric thin film according to claim 14, in which the dopant concentration increases or decreases from the first electrode to the second electrode.

16. The piezoelectric thin film element according to claim 14, in which the dopant concentration increases from the first electrode and decreases to the second electrode.

17. The piezoelectric thin film element according to claim 1, in which one or more thin film layers define a gradient in dopant concentration within the thin film layer.

18. An actuator for a printhead, wherein the actuator comprises the piezoelectric thin film element according to claim 1.

19. A printhead comprising the actuator of claim 18.

20. A method for manufacturing a piezoelectric thin film element comprising:
   forming a first piezoelectric thin film layer having perovskite crystal structure ($ABO_3$) on a first electrode;
   forming one or more piezoelectric thin film layers having the perovskite $ABO_3$ crystal structure on the first piezoelectric thin film layer to form a laminate comprising a plurality of piezoelectric thin film layers;
   forming a second electrode on top the plurality of piezoelectric thin film layers; and
   coupling a controller to the first electrode and the second electrode,
   wherein:
     the first piezoelectric thin film layer is singly doped by a first donor dopant,
     a second layer of the plurality of piezoelectric thin film layers is singly doped by a second dopant different from the first donor dopant of the first thin film layer, and
     the controller is configured to apply a drive voltage that causes the plurality of piezoelectric thin film layers to deform.

* * * * *